United States Patent
Ciavatti et al.

(10) Patent No.: US 9,397,191 B2
(45) Date of Patent: Jul. 19, 2016

(54) METHODS OF MAKING A SELF-ALIGNED CHANNEL DRIFT DEVICE

(71) Applicant: GLOBALFOUNDRIES Inc., Grand Cayman (KY)

(72) Inventors: Jerome Ciavatti, Hopewell Junction, NY (US); Yanxiang Liu, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/922,308

(22) Filed: Oct. 26, 2015

(65) Prior Publication Data

US 2016/0056265 A1   Feb. 25, 2016

Related U.S. Application Data

(63) Continuation of application No. 13/912,448, filed on Jun. 7, 2013, now Pat. No. 9,202,911.

(51) Int. Cl.

| H01L 29/66 | (2006.01) |
|---|---|
| H01L 21/265 | (2006.01) |
| H01L 29/78 | (2006.01) |
| H01L 29/08 | (2006.01) |
| H01L 21/324 | (2006.01) |
| H01L 21/8234 | (2006.01) |
| H01L 29/06 | (2006.01) |

(52) U.S. Cl.
CPC .... *H01L 29/66575* (2013.01); *H01L 21/26513* (2013.01); *H01L 21/324* (2013.01); *H01L 21/823418* (2013.01); *H01L 21/823481* (2013.01); *H01L 21/823493* (2013.01); *H01L 29/0642* (2013.01); *H01L 29/0847* (2013.01); *H01L 29/0882* (2013.01); *H01L 29/6659* (2013.01); *H01L 29/66659* (2013.01); *H01L 29/66681* (2013.01); *H01L 29/7835* (2013.01)

(58) Field of Classification Search
CPC ............. H01L 29/66575; H01L 29/0642; H01L 29/66659; H01L 29/66681; H01L 29/0882; H01L 21/823418; H01L 21/823481; H01L 21/823493; H01L 21/26513; H01L 21/324
USPC .................................................. 438/286, 294
See application file for complete search history.

(56) References Cited

U.S. PATENT DOCUMENTS

| 6,677,210 B1 | 1/2004 | Hebert | |
|---|---|---|---|
| 2005/0067662 A1 | 3/2005 | Lee et al. | |
| 2007/0080401 A1* | 4/2007 | Yang | H01L 21/26586 257/346 |
| 2012/0139051 A1* | 6/2012 | Ranade | H01L 29/105 257/368 |

* cited by examiner

*Primary Examiner* — Asok K Sarkar
*Assistant Examiner* — Dmitriy Yemelyanov
(74) *Attorney, Agent, or Firm* — Amerson Law Firm, PLLC

(57) ABSTRACT

An isolation region is formed in a semiconductor substrate to laterally define and electrically isolate a device region and first and second laterally adjacent well regions are formed in the device region. A gate structure is formed above the device region such that the first well region extends below an entirety of the gate structure and a well region interface formed between the first and second well regions is laterally offset from a drain-side edge of the gate structure. Source and drain regions are formed in the device region such that the source region extends laterally from a source-side edge of the gate structure and across a first portion of the first well region to a first inner edge of the isolation region and the drain region extends laterally from the drain-side edge and across a second portion of the first well region.

20 Claims, 9 Drawing Sheets

US 9,397,191 B2

METHODS OF MAKING A SELF-ALIGNED CHANNEL DRIFT DEVICE

BACKGROUND

1. Field of the Disclosure

The present disclosure is generally directed to the manufacture of semiconductor devices, and, more specifically, to various methods of forming a novel self-aligned channel drift MOS (SCDMOS) device.

2. Description of the Related Art

Lateral double diffused metal oxide semiconductor (LDMOS) field effect transistor devices are used in many applications, such as power management for cell phones, ADSL drivers, LED displays, LCD display drivers, high power amplifiers for wireless base stations, etc. LDMOS devices are sometimes referred to as so-called "drift MOS" devices, and they can be manufactured as either an N-type device or a P-type device. LDMOS devices are typically formed in an epitaxial layer deposited or grown on a semiconductor substrate. An LDMOS transistor has a source region separated from an extended drain region by a channel. The dopant distribution in the channel region is formed by lateral diffusion of dopants from the source side of the channel region, forming a laterally graded channel region. The source region and extended drain region are of the same conductivity type (e.g., N-type), while the epitaxial layer and the channel region are of the opposite conductivity type (e.g., P-type). A gate electrode is used to actuate the LDMOS transistor. LDMOS transistors are used extensively in RF applications because of their advantageous linearity, power gain and breakdown voltage characteristics.

FIG. 1A is a cross-sectional view that schematically depicts an illustrative embodiment of a prior art LDMOS device 10. In the depicted example, the illustrative LDMOS device 10 is an N-type device that is formed above a semiconductor substrate 12. Illustrative isolation regions (not shown) are formed in the substrate 12 to electrically isolate the LDMOS device 10 from other transistor devices. The device 10 generally includes a P-doped P-well 14, an N-doped N-well 16, an $N^+$-doped source region 18 and an $N^+$-doped drain region 20. The LDMOS device 10 further includes a gate structure 22 having a gate insulation layer 22A and a conductive gate electrode layer 22B, sidewall spacers 24 and a drain-side shallow trench isolation (STI) structure 19. As depicted, the drain-side STI structure 19 is positioned entirely within the N-well 16 and a portion of the drain-side STI structure 19 extends under the gate structure 22. In general, the drain-side STI structure 19 is provided to increase the drain resistance and to drop the voltage directly applied at the drain region 20 so that a reasonable potential is transferred at the gate on the drain side. That is, the STI structure 19 helps increase the voltage drop between the drain contact and the drain side of the gate structure 22. In some cases, the drain-side STI structure 19 may be omitted and the drain region 20 is simply laterally offset from the drain-side edge of the gate structure 22. The P-well 14 is formed so that it extends partially under the gate structure 22, but not all the way across the gate structure 22. Similarly, the N-well 16 is positioned such that it extends partially under the gate structure 22, but to a lesser degree than does the P-well 14. The channel length 30 of the device 10 shown in FIG. 1A is set by the portion of the gate structure 22 that is positioned above the P-well 14. The P-well 14 and the N-well 16 overlap by the distance 32. The dimension 34 is sometimes referred to as the "field-plate extension" because, in operation, the maximum electrical field is present at the gate corner on the drain side. The extension 34 of the gate effectively moves the location of the maximum electric field onto the STI structure 19 and away from the gate insulation layer 22A. The source region 18 is typically formed by performing both a lightly-doped extension implant region (prior to forming the spacer 24) and a heavier-doped deep source region. The drain region 20 is typically formed by only forming a deep heavier-doped drain region, i.e., the extension implant process is typically omitted when forming the drain 20. As can be observed from FIG. 1A, the channel length 30 of the device 10 is determined based upon the placement of the P-well 14 and the N-well 16. Any misalignment when forming the wells 14, 16 can impact the ultimate performance of the device 10. For example, if the N-well 16 is not positioned far enough under the gate structure 22 as intended by the design process, the channel length 30 of the device 10 will be greater than anticipated by the design process and the device 10 will operate slower than anticipated. Thus, extreme precision is required when positioning the wells 14, 16 in the substrate 12 and when forming the gate structure 22 to insure that all components of the device 10 are in their proper and intended relative positions.

FIG. 1B depicts another example of a prior art integrated circuit device 11 that includes of an illustrative N-type LDMOS device 11N and a P-type LDMOS device 11P that are formed in and above the substrate 12 and electrically isolated from one another by an illustrative STI region 21. In this example the N-type device 11N is formed above the P-well 14, while the P-type device 11P is formed above the N-well 16. Each of the devices includes a gate structure 22, spacers 24, a source region 18 and a drain region 20. In the embodiment depicted in FIG. 1B, the source/drain regions 18/20 are typically formed by forming both extension regions and deep doped regions in the substrate 12. Unlike the device 10 depicted in FIG. 1A, the device 11 includes a so-called silicide block layer 25 positioned on the drain regions 20 of the devices adjacent the spacers 24. As its name implies, the purpose of the silicide block layer 25 is to prevent the formation of a metal silicide material on the covered portion of the drain region 20 so as to effectively position the drain 20 farther away from the drain-side edge of the gate structure due to the very high electrical field present at the drain-side edge of the gate structure 22 when the devices 11N, 11P are in operation. The length of the silicide block layer 25 may vary depending upon the particular application, and it may be made of a variety of materials, e.g., silicon nitride. The operational usefulness of the illustrative LDMOS devices 11N, 11P depicted in FIG. 1B are typically limited by the junction breakdown voltages, which continues to decrease, especially in advanced CMOS applications that have very low drain voltages (Vdd).

Generally, the present disclosure is directed to various embodiments of a novel self-aligned channel drift MOS device (SCDMOS), and various methods of making such an SCDMOS device, that may solve or reduce one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various methods of forming novel self-aligned channel drift MOS (SCDMOS) devices. In one illustrative embodiment disclosed herein, a method includes forming an isolation region in a semiconductor substrate so as to laterally define and electrically isolate a device region, forming a first well region doped with a first type of dopant material in the device region, and forming a second well region doped with a second type of dopant material in the device region laterally adjacent to the first well region, wherein the second type of dopant material has an opposite conductivity type from the first type of dopant material. The disclosed method further includes, among other things, forming a gate structure above the device region, wherein the first well region extends below an entirety of the gate structure such that a well region interface formed between the first and second well regions is laterally offset from a drain-side edge of the gate structure, and forming source and drain regions doped with the second type of dopant material in the device region, wherein the source region extends laterally from a source-side edge of the gate structure and across a first portion of the first well region to a first inner edge of the isolation region and the drain region extends laterally from the drain-side edge and across a second portion of the first well region.

In a further exemplary embodiment, a method is disclosed that includes, among other things, forming an isolation region in a semiconductor substrate so as to laterally define and electrically isolate a device region, forming a first well region doped with a first type of dopant material in the device region, and forming a second well region doped with a second type of dopant material in the device region laterally adjacent to the first well region, wherein the second type of dopant material has an opposite conductivity type from the first type of dopant material. Additionally, the illustrative method further includes forming a gate structure above the device region, wherein the first well region extends below an entirety of the gate structure such that a well region interface formed between the first and second well regions is laterally offset from a drain-side edge of the gate structure. Furthermore, after forming the gate structure, a first ion implantation process is performed to implant the second type of dopant material into the device region so as to form a source extension implant region that extends laterally from a source-side edge of the gate structure across a source-side portion of the first well region and to form a drain extension implant region that extends laterally from a drain-side edge of the gate structure across a drain-side portion of the first well region, across the well region interface, and across at least a portion of the second well region.

Yet another illustrative method of the present disclosure includes forming an isolation region in a semiconductor substrate so as to laterally define and electrically isolate a device region, forming a first well region doped with a first type of dopant material in the device region, and forming a second well region doped with a second type of dopant material in the device region laterally adjacent to the first well region, wherein the second type of dopant material has an opposite conductivity type from the first type of dopant material. Additionally, a gate structure is formed above the device region, wherein the first well region extends below an entirety of the gate structure such that a well region interface formed between the first and second well regions is laterally offset from a drain-side edge of the gate structure, and a source region doped with the second type of dopant material is formed in a first portion of the first well region, the source region having a source extension portion that extends laterally below a source-side edge of the gate structure. The method also includes forming a drain region doped with the second type of dopant material in the second well region and in a second portion of the first well region, the drain region including a drain extension portion that extends laterally below the drain-side edge of the gate structure, wherein a maximum lateral width of the drain region is greater than a maximum lateral width of the second well region.

BRIEF DESCRIPTION OF THE DRAWINGS

The disclosure may be understood by reference to the following description taken in conjunction with the accompanying drawings, in which like reference numerals identify like elements, and in which.

Figure 1A:
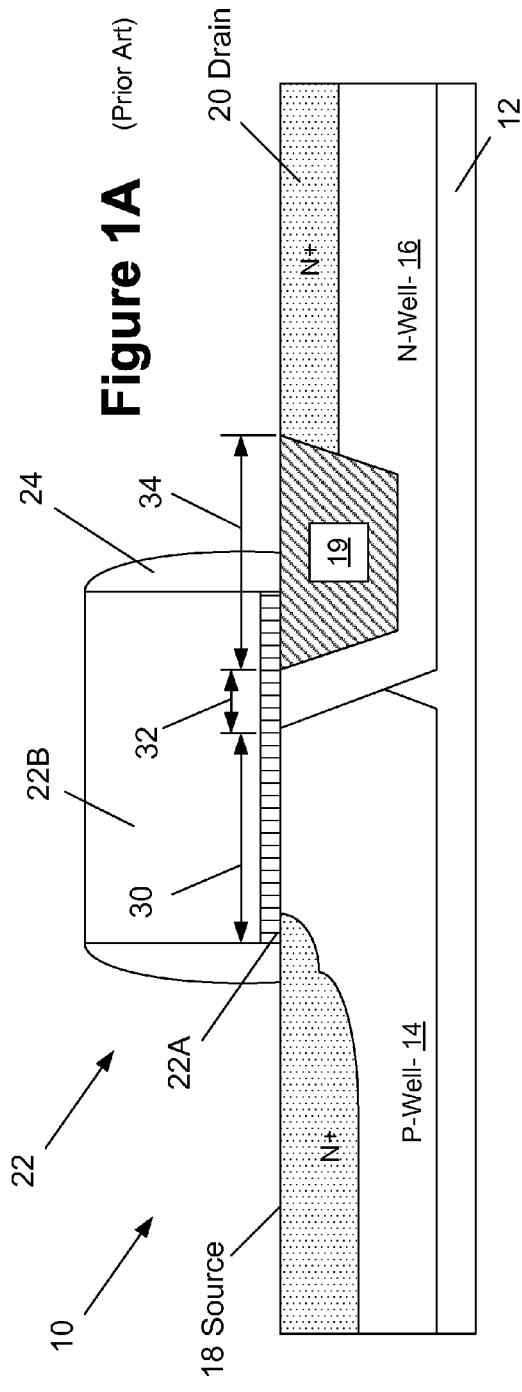
FIGS. 1A-1B depict illustrative embodiments of prior art LDMOS devices.
Figure 1B:
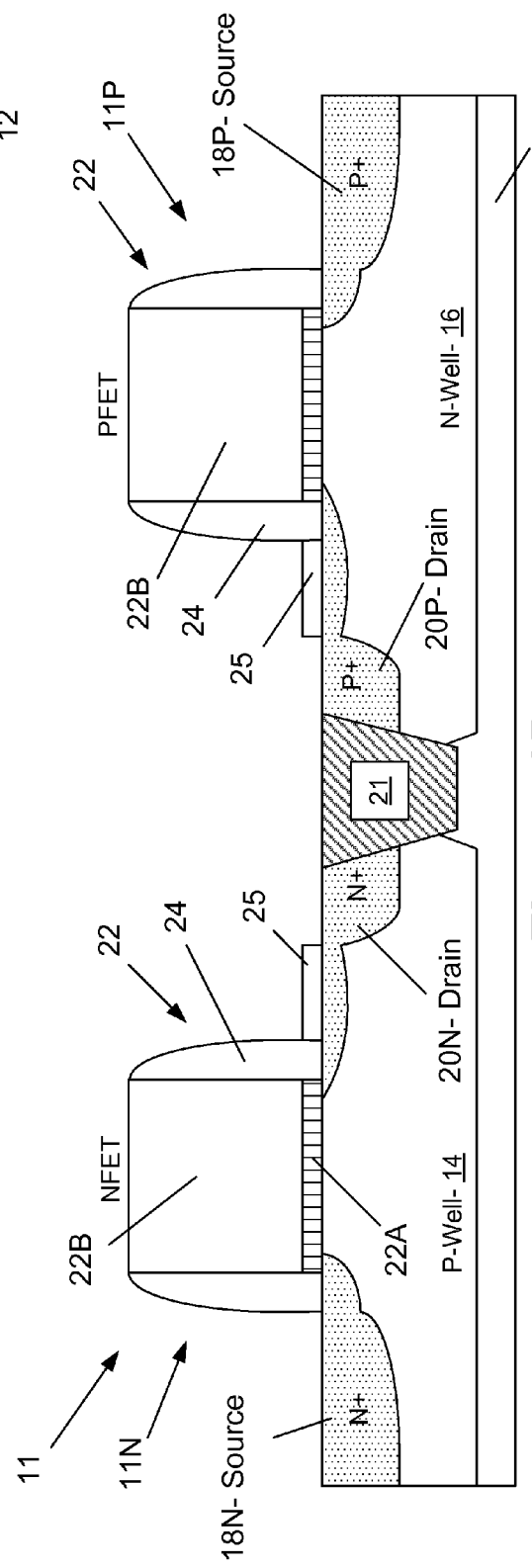

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of a novel self-aligned channel drift MOS device (SCDMOS) and various methods of making such an SCDMOS device. As will be readily apparent to those skilled in the art upon a complete reading of the present application, the presently disclosed devices may be employed in a variety of integrated circuit products, including, but not limited to, RF devices, logic devices, memory devices, high voltage devices, power management devices, etc.

FIGS. 2A-2F depict one illustrative process flow for forming various embodiments of a novel self-aligned channel drift MOS device (SCDMOS) 100 disclosed herein. The SCDMOS device 100 is formed above an illustrative semiconductor substrate 102, such as a silicon substrate having a bulk configuration. The substrate 102 may also be the active layer of a so-called silicon-on-insulator (SOI) configuration. Of course, the substrate 102 may be any one of a variety of materials other than silicon, depending upon the particular application. In the example depicted in FIGS. 2A-2H, an N-type SCDMOS device 100 will be depicted. However, as will be appreciated by those skilled in the art, the novel SCDMOS device 100 disclosed herein may also be formed as a P-type device, wherein the various doped regions discussed below would be doped with the opposite or inverse type of dopant material.

Figure 2A:
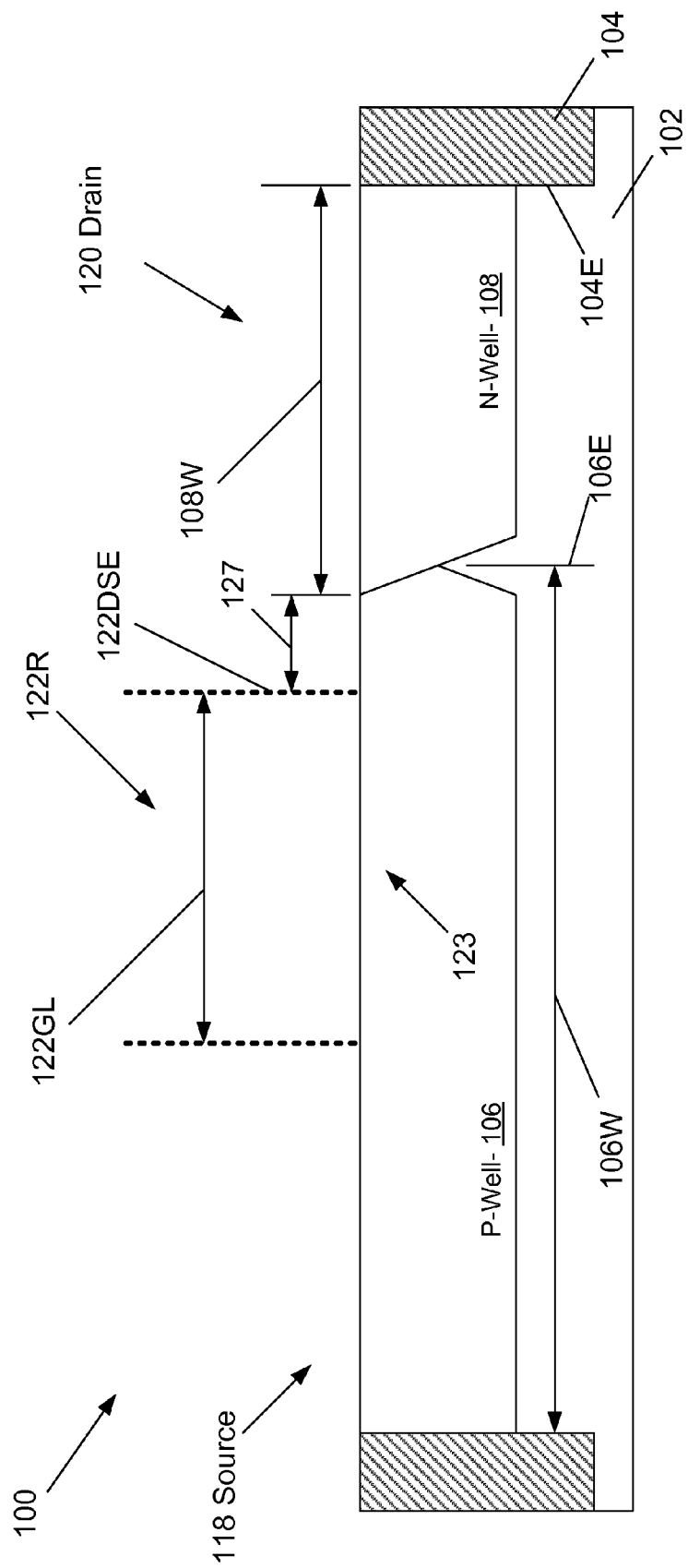
FIGS. 2A-2H depict various illustrative embodiments of a novel self-aligned channel drift MOS device (SCDMOS) and various methods of making such an SCDMOS device.

At the point of processing shown in FIG. 2A, an illustrative isolation region 104 (with an inner edge 104E) has been formed in the substrate 102 using traditional techniques so as to electrically isolate the device 100 from other semiconductor devices that will be formed in the substrate. Also depicted in FIG. 2A are an illustrative P-well 106 (source-side well region) and an illustrative N-well 108 (drain-side well region). The wells 106, 108 may be formed before or after the formation of the isolation region 104. The wells 106, 108 may be formed by forming patterned implant masks, e.g., patterned photoresist masks, and implanting the desired P-type or N-type dopants at the desired dopant dose. The lithography and ion implantation processes that are used to form the wells 106, 108 in the substrate 102 are well known to those skilled in the art. The dopant concentration in the wells 106, 108 may vary depending upon the particular application. The dopant type used in the source-side well region 106 will be opposite to the type of dopant used in the drain-side well region 108.

Also depicted in FIG. 2A is a gate region 122R where a gate structure 122 will be formed for the device 100. The location of the drain-side edge 122DSE when the gate structure 122 is formed is also depicted in FIG. 2A. Additionally, the locations where a source region 118 and a drain region 120 for the device 100 will be formed are also indicated. The source/drain regions 118/120 will be formed using the same type of dopant material, e.g., N-type dopant materials (but perhaps using a different dopant species), as is used in forming the drain-side well region 108. The source-side well region 106 will be formed using dopant materials that are of a type that is opposite to the dopant type used in forming the source/drain regions 118/120 and the drain-side well region 108.

Importantly, the P-well 106 is formed with a lateral width 106W such that the edge 106E of the P-well 106 will extend past the drain-side edge 122DSE of the gate structure 122. Stated another way, the gate structure 122 will be positioned entirely over the P-well region 106, i.e., the channel region 123 of the device 100 will be positioned entirely above the P-well region 106. Additionally, the N-well region 108 will be formed with a lateral width 108W such that the N-well region 108 does not extend under any portion of the gate structure 122. Accordingly, using the methods disclosed herein, the gate length 122GL of the novel SCDMOS device 100 disclosed herein is not dependent upon the precise location of the P-well region 106 relative to the N-well region 108 as the intersection between the two wells 106, 108 occurs at a point that is laterally spaced away from the side of the gate structure 122. The widths 106W and 108W may vary depending upon the particular application. In one illustrative embodiment, the width 108W of the N-well 108 is set such that there is a space 127 between the N-well 108 and the drain-side edge 122DSE of the gate structure 122 (when it is formed). The size of the space 127 may vary depending upon the particular application. In one illustrative embodiment, the space 127 may be a distance that falls within the range of about 0-300 nm.

Figure 2B:
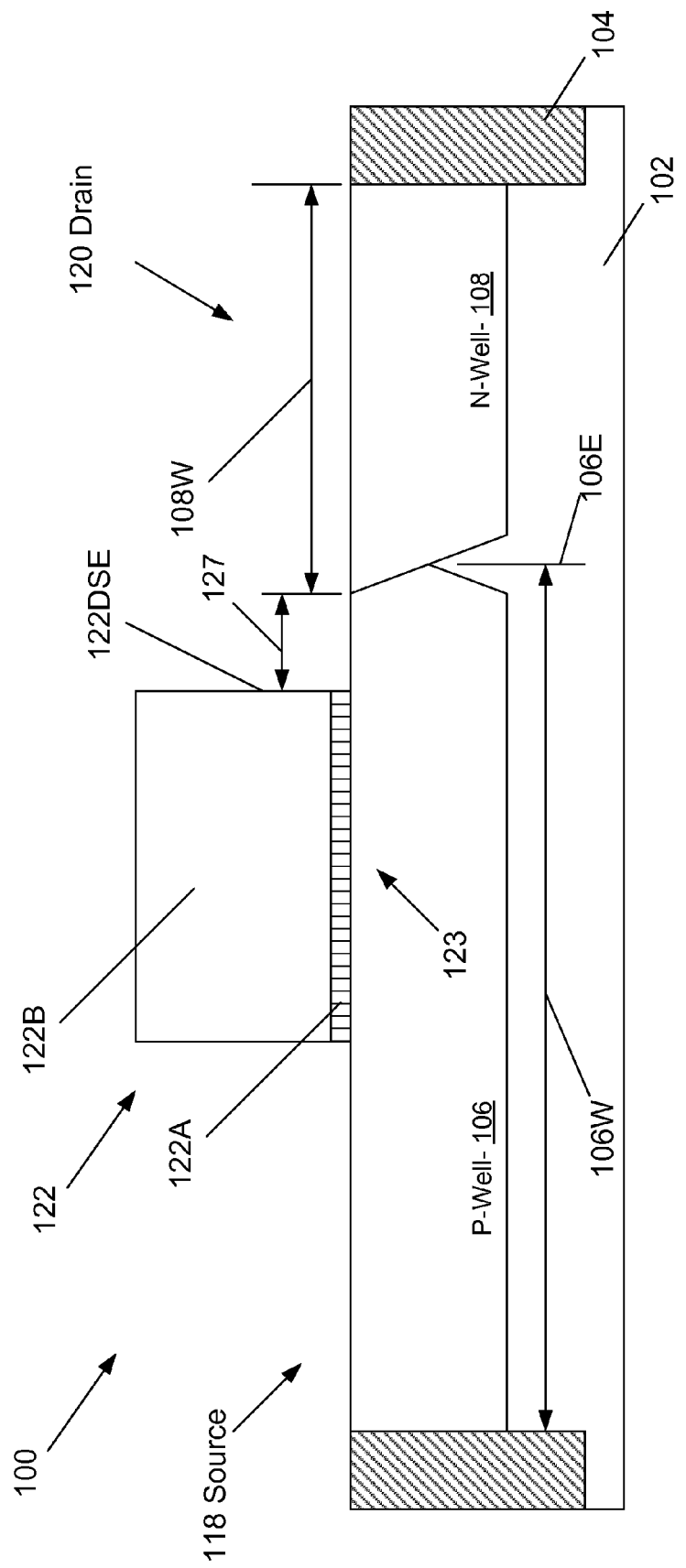

FIG. 2B depicts the device 100 after an illustrative gate structure 122 has been formed above the substrate 102. The gate structure 122 is intended to be representative in nature as it may also be any one of a variety of different materials and it may be formed using a variety of different techniques. In one example, the gate structure 122 may include an illustrative gate insulation layer 122A and one or more conductive layers that serve as the gate electrode 122B. The gate structure 122 may be of any desired construction and may include any of a variety of different materials, such as one or more conductive layers made of polysilicon or a metal, etc., and one or more layers of insulating material, such as silicon dioxide, a high-k material, etc. Additionally, the gate structure 122 for an N-type device may have different material combinations as compared to a gate structure 122 for a P-type device. Thus, the particular details of construction of the gate structure 122, and the manner in which the gate structure 122 is formed, should not be considered a limitation of the present invention. For example, the gate structure 122 may be made using so-called "gate-first" or "gate-last" techniques.

Figure 2C:
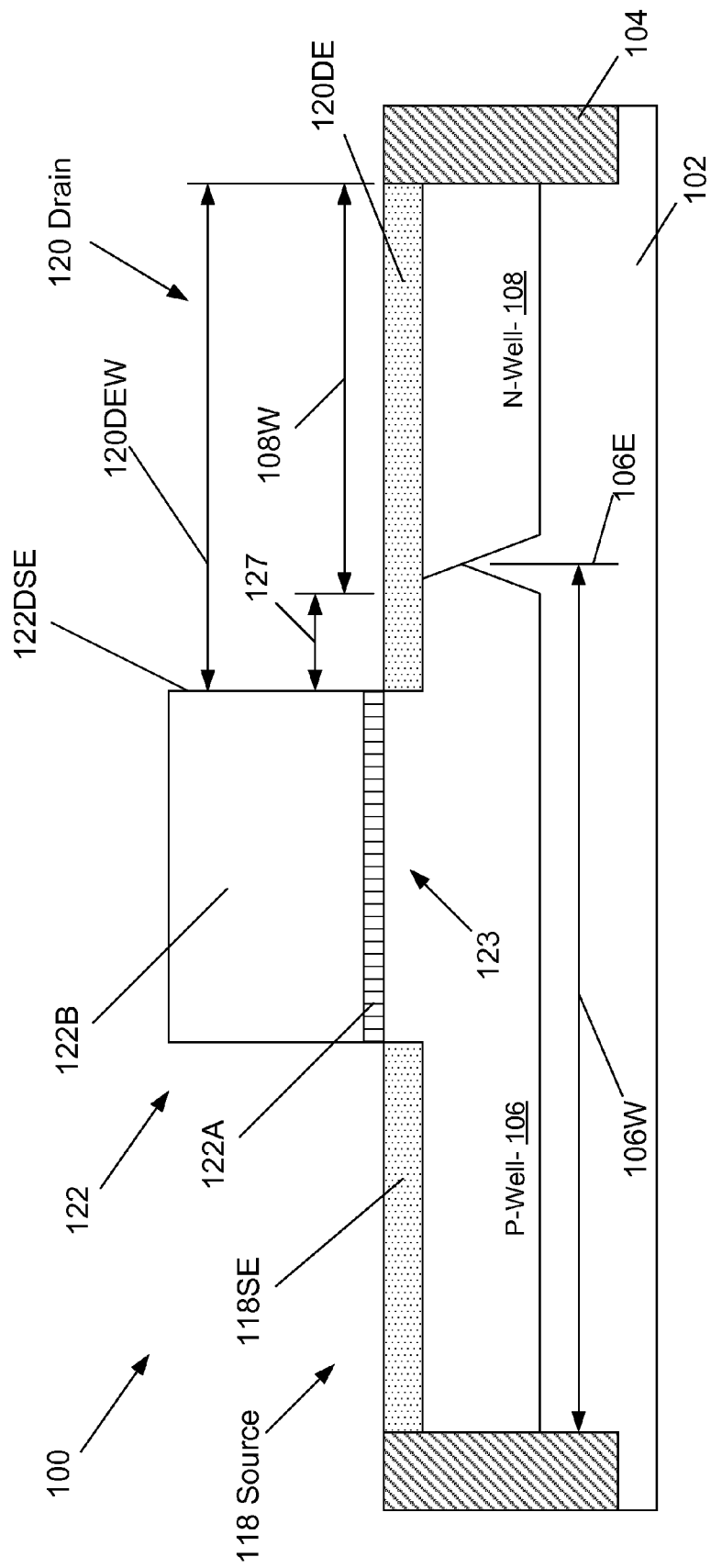

FIG. 2C depicts the device 100 after an ion implant process was performed through an implant mask (not shown) to form a source extension implant region 118SE and a drain extension implant region 120DE in the substrate 102. Note that, in some applications, a very thin sidewall spacer (not shown) may be formed adjacent the gate structure 122 prior to forming the source extension implant region 118SE and the drain extension implant region 120DE. In the depicted example, N-type dopants are implanted to form the source extension implant region 118SE and drain extension implant region 120DE. The dopant dose and implant energy used during the extension implant process may vary depending on the particular application. Of course, for a P-type device, P-type dopant materials would be implanted to form the source extension implant region 118SE and drain extension implant region 120DE. Note that, in one embodiment, the source extension implant region 118SE and drain extension implant region 120DE span the entire distance between the gate structure 122 and the isolation region 104. Additionally, the drain extension implant region 120DE has a width 120DEW that is wider than the width 108W of the underlying N-well region 108, and that a portion of the drain extension implant region 120DE is positioned above a portion of the P-well 106.

Figure 2D:
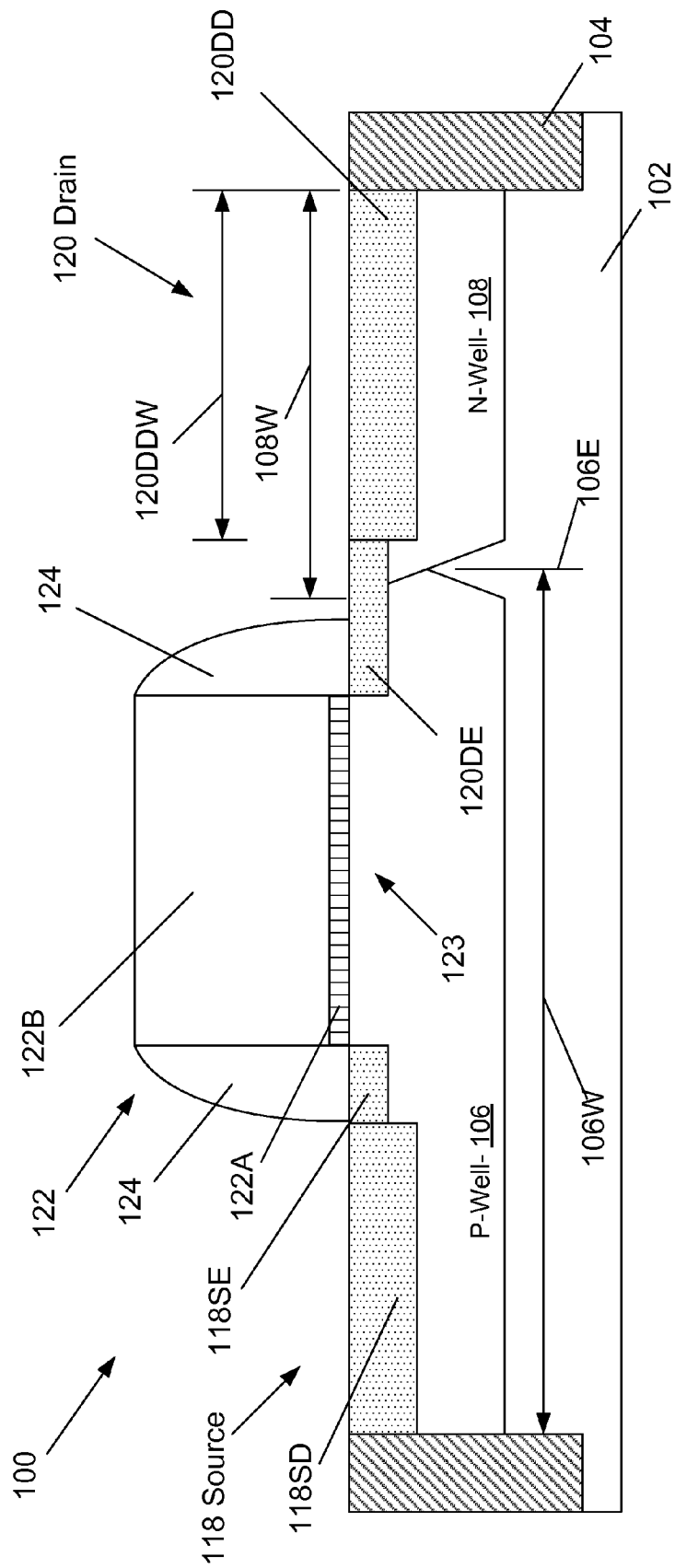

FIG. 2D depicts the device 100 after several process operations have been performed. First, the extension implant mask was removed. Then, one or more sidewall spacers 124 were formed adjacent the gate structure 122. The spacers 124 may be made of a variety of materials, e.g., silicon nitride, and they may be formed by depositing a layer of spacer material and performing an anisotropic etching process on the layer(s) of spacer material. Thereafter, another ion implantation mask (not shown) was formed and a deep source/drain implant process was performed through that implant mask to form a deep source implant region 118SD and a deep drain implant region 120DD in the substrate 102. The deep source implant region 118SD is self-aligned relative to the spacer 124. The implant masking layer used during the deep source/drain implant process was formed such that the drain implant region 120DD is moved laterally away from the gate structure 122, as depicted in FIG. 2D. In the depicted example, N-type dopants are implanted to form the deep source implant region 118SD and the deep drain implant region 120DD. The dopant dose and implant energy used during the deep source/drain implant process may vary depending on the particular application. Of course, for a P-type device, P-type dopant materials would be implanted to form the deep source implant region 118SD and the deep drain implant region 120DD. Additionally, in the depicted example, the deep drain implant region 120DD has a width 120DDW that is less than the width 108W of the underlying N-well region 108 as well. However, in some applications, the deep drain implant region 120DD may be formed with a greater width 120DDW such that a portion of the deep drain implant region 120DD is positioned above a portion of the P-well 106.

Figure 2E:
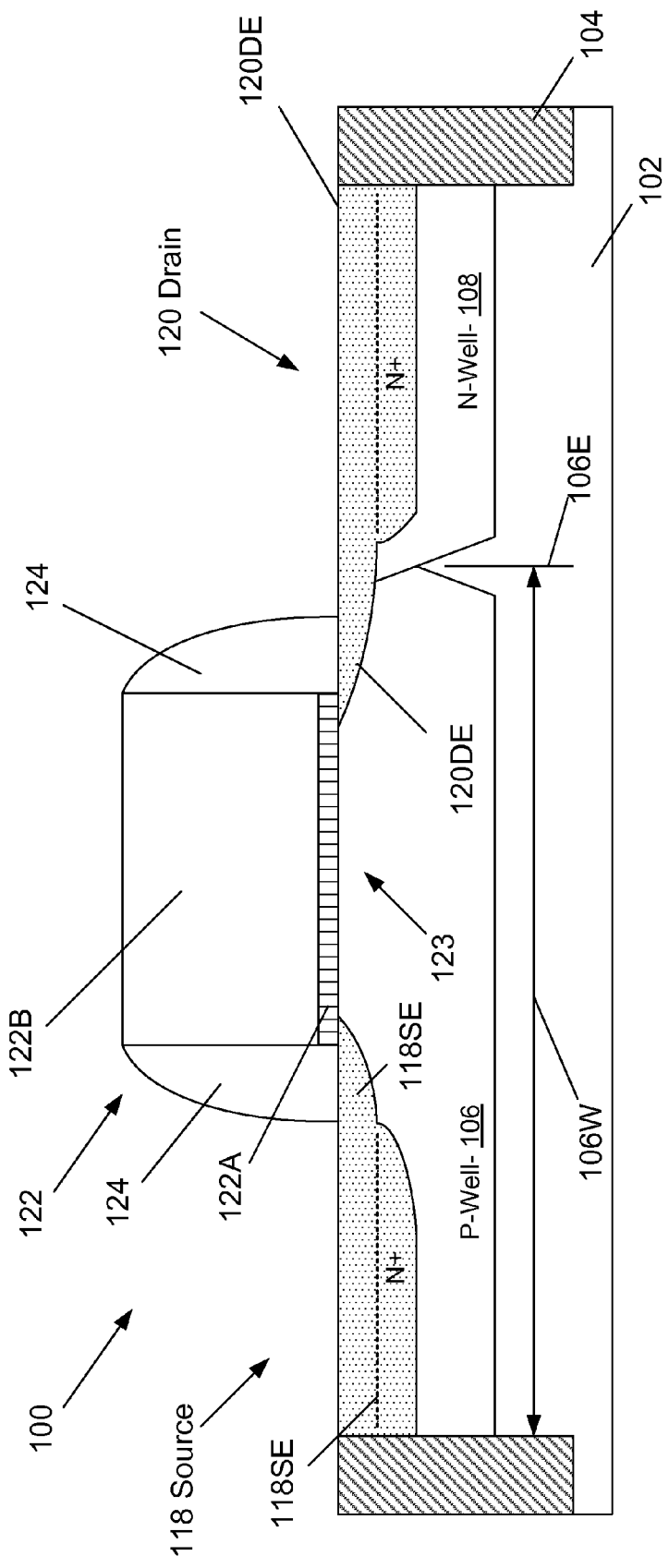

FIG. 2E depicts the device 100 after a heating or anneal process was performed to activate the implanted dopant materials and to repair damage to the lattice structure of the substrate 102 resulting from the various ion implantation processes performed on the device. This results in the formation of the final source region 118 and the final drain region 120. During the anneal process, some of the implanted dopant materials migrate under the edge of the gate structure 122. As noted above, the final drain region 120 is laterally wider than the width of the underlying N-well 108, and a portion of the final drain region 120 is positioned above a portion of the P-well 106.

Figure 2F:
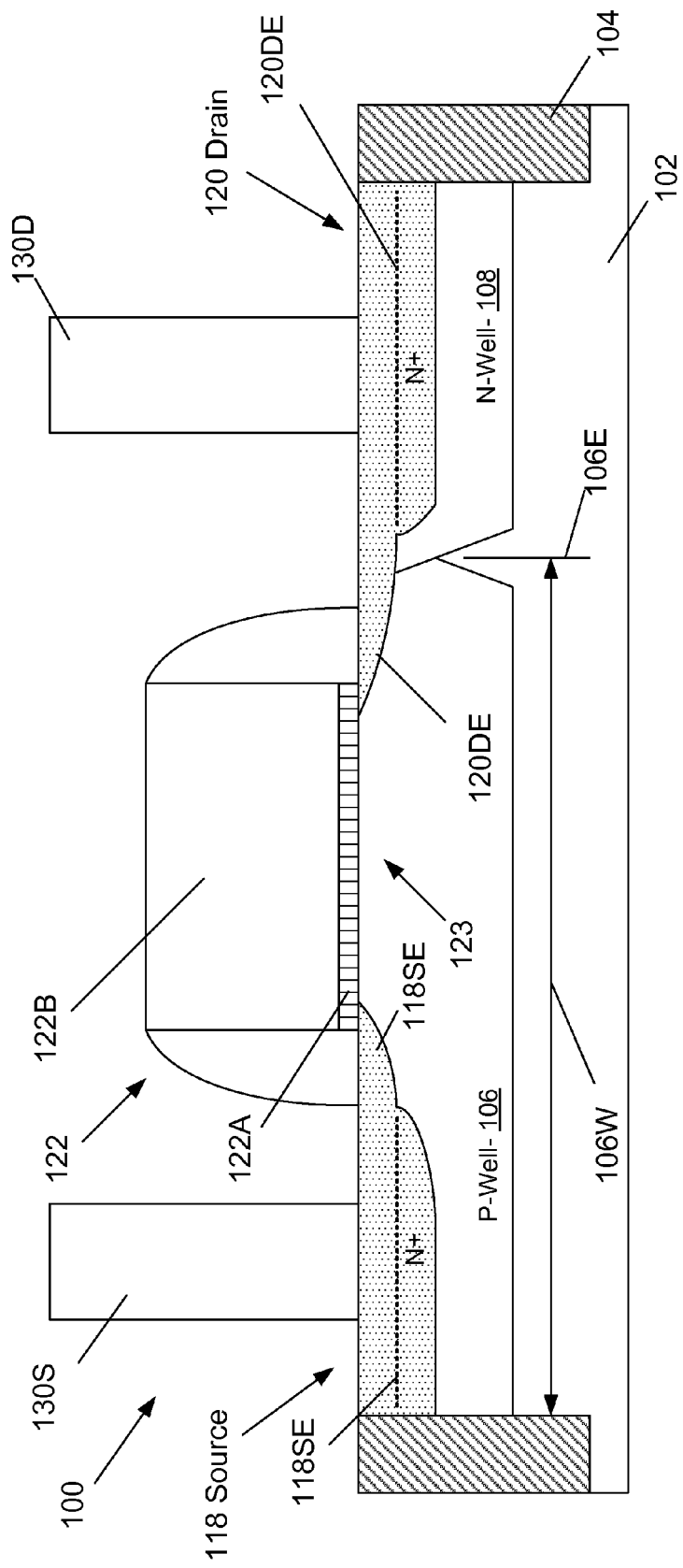

FIG. 2F depicts the device 100 after an illustrative source contact 130S and an illustrative drain contact 130D was formed on the device 100. In some cases, a metal silicide material (not shown) will have previously been formed on the source/drain regions 118/120 prior to formation of the source/drain contacts 130S/130D. Typically, the source/drain contacts 130S/130D will be formed in a previously formed layer of insulating material (not shown). The source/drain contacts 130S/130D may be formed from a variety of conductive materials, and they may have any desired configuration. The manner in which the source/drain contacts 130S/130D are formed are well known to those skilled in the art.

Figure 2G:
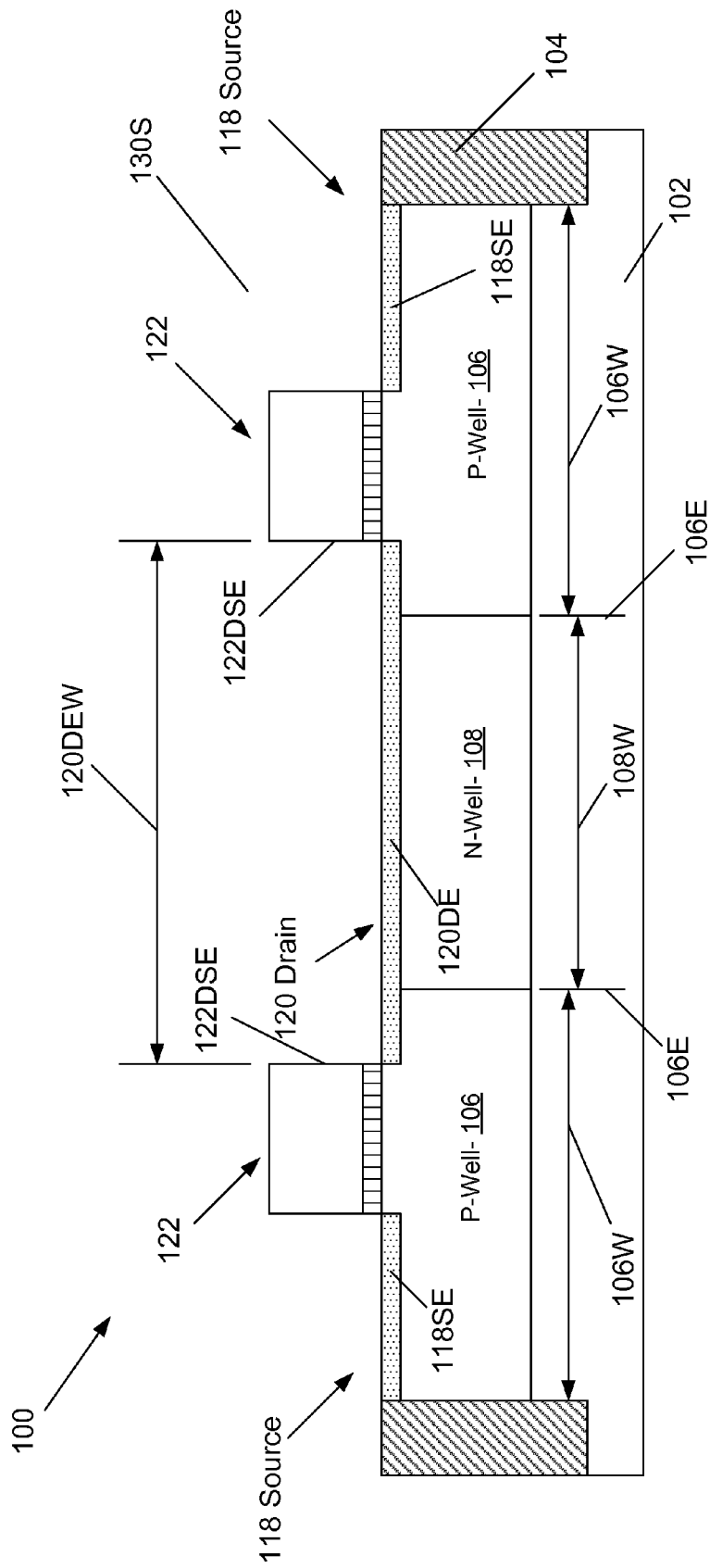
Figure 2H:
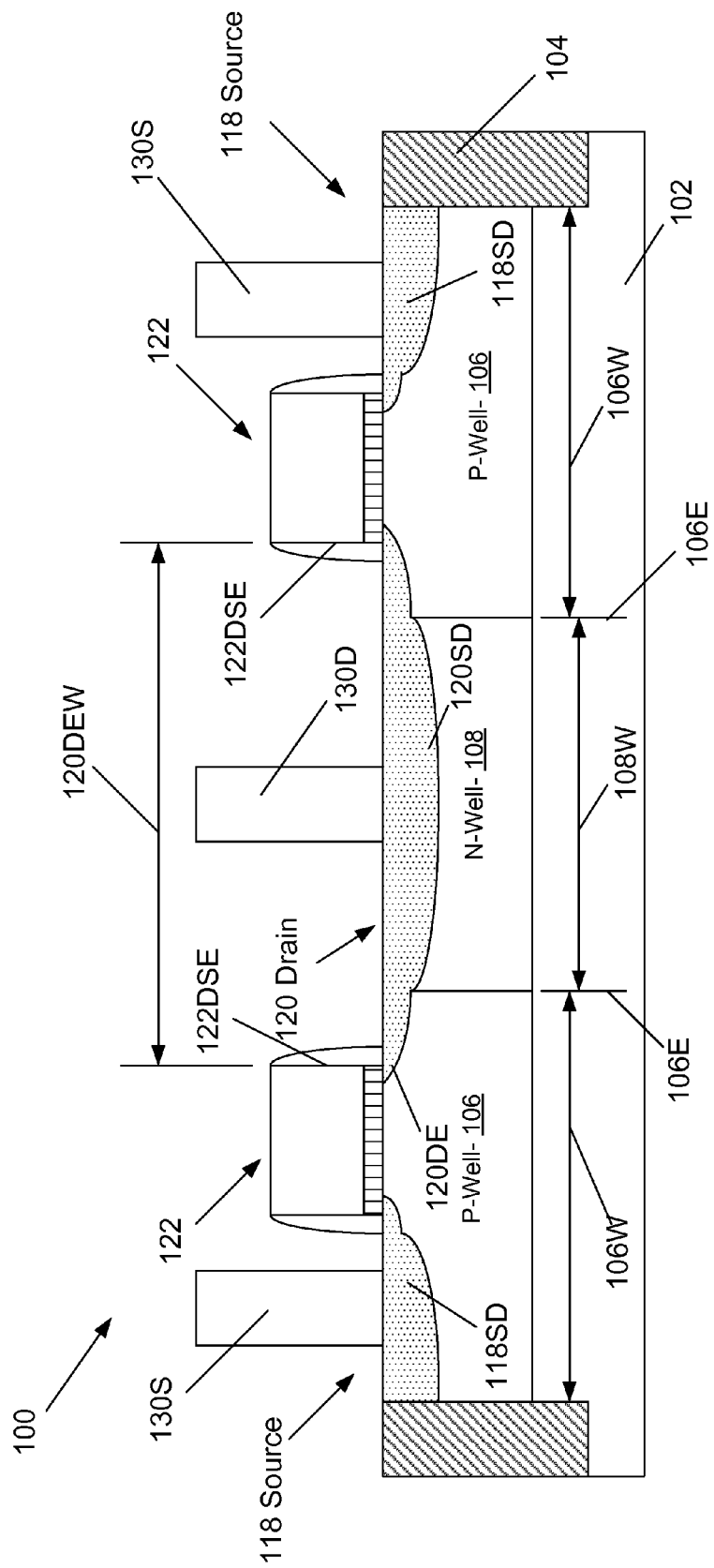

FIG. 2G-2H depict an embodiment of the device 100 where the device includes two gate structures 122, two source regions 118 and a single drain region 120. FIG. 2G depicts the device 100 at a point in the process flow after the above-described gate structures 122 were formed and after the above-described extension implant process was performed to form the depicted source extension implant region 118SE and drain extension implant region 120DE in the substrate 102. FIG. 2H depicts the device 100 after the sidewall spacers 124 were formed adjacent the gate structure 122, the deep source/drain implant regions 118SD, 120SD were formed in the substrate 102 and after an anneal process was performed to activate the implanted dopant materials and to repair damage to the lattice structure of the substrate 102 resulting from the various ion implantation processes performed on the device. As before, this results in the formation of the final source regions 118 and the final drain region 120. As noted above, the final drain region 120 is laterally wider than the width 108W of the underlying N-well 108, and portions of the final drain region 120 are positioned above a portion of each of the P-wells 106. Also depicted in FIG. 2H are the above-described source/drain contacts 130S/130D.

As will be appreciated by those skilled in the art after a complete reading of the present application, various novel embodiments of the device 100 are disclosed herein. In one embodiment, the device includes a source region 118 and a drain region 120 formed in a semiconductor substrate 102, wherein the source/drain regions 118/120 are doped with a first type of dopant material, a gate structure 122 positioned above the substrate 102 that is laterally positioned between the source region 118 and the drain region 120 and a drain-side well region 108 positioned in the substrate 102 under a portion, but not all, of the entire lateral width of the drain region 120, wherein the drain-side well region 106 is also doped with the first type of dopant material (but perhaps a different dopant species). The device also includes a source-side well region 106 positioned in the substrate 102 under an entire width of the source region 118 and under a portion, but not all, of the drain region 120 and a part of the extension portion 120DE of the drain region 120 is positioned under a portion of the gate structure 122. In more detailed embodiments disclosed herein, the drain region 120 has a maximum lateral width that is wider than a maximum lateral width 108W of the drain-side well region 108, the source-side well region 106 contacts the drain-side well region 108 at a point that is laterally positioned between the drain-side edge 122DSE of the gate structure 122 and an inner edge 104E of the isolation region 104, and the source-side well region 106 has a lateral width 106W that is wider than a combined lateral width of the source region 118 and the gate structure 122.

Another illustrative embodiment of the device 100 disclosed herein includes a source region 118 and a drain region 120 formed in the substrate 102, wherein the source/drain regions are doped with a first type of dopant material, and wherein the drain region 120 includes an extension region 120DE that defines a maximum lateral width of the drain region 120, a gate structure 122 positioned above the substrate 102 between the source/drain regions 118/120 and a drain-side well region 108 positioned in the substrate 102 under a portion, but not all, of the drain region 120, wherein the drain-side well region 108 is also doped with the first type of dopant material and it has a lateral width 108W that is less than the maximum lateral width of the drain region 120. In this embodiment, the device 100 also includes a source-side well region 106 positioned in the substrate 102 under at least the source region 118, wherein the source-side well region 106 is doped with a second type of dopant material that is opposite to the first type of dopant material.

Yet another embodiment of the device 100 disclosed herein includes an isolation region 104 positioned in the substrate 102 so as to electrically isolate the device 100, a source region 118 and a drain region 120 formed in the substrate 102, wherein the source and drain regions 118/120 are doped with a first type of dopant material, and wherein the drain region 120 includes an extension region 120DE that defines a maximum lateral width of the drain region and a gate structure 122 positioned above the substrate 102, wherein a part of the extension region 120DE is positioned under a portion of the gate structure 122. In this embodiment, the device also includes a drain-side well region 108 positioned in the substrate 102 under a portion, but not all, of the drain region, wherein the drain-side well region 108 is also doped with the first type of dopant material, and wherein a maximum lateral width 108W of the drain-side well region 108 is less than a maximum lateral width of the drain region 120 and a source-side well region 106 positioned in the substrate 102, wherein the source-side well region 106 is doped with a second type of dopant that is opposite to the first type of dopant material, and wherein the source-side well region 106 contacts the drain-side well region 108 at a point that is laterally positioned between a drain-side edge 122DSE of the gate structure 122 and an inner edge 104E of the isolation region 104.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an isolation region in a semiconductor substrate so as to laterally define and electrically isolate a device region;
    forming a first well region doped with a first type of dopant material in said device region;
    forming a second well region doped with a second type of dopant material in said device region laterally adjacent to said first well region, wherein said second type of dopant material has an opposite conductivity type from said first type of dopant material;
    forming a gate structure above said device region, wherein said first well region extends below an entirety of said gate structure such that a well region interface formed between said first and second well regions is laterally offset from a drain-side edge of said gate structure; and
    forming source and drain regions doped with said second type of dopant material in said device region, wherein said source region extends laterally from a source-side edge of said gate structure and across a first portion of said first well region to a first inner edge of said isolation region and said drain region extends laterally from said drain-side edge and across a second portion of said first well region.

2. The method of claim 1, wherein said drain region further extends laterally across said well region interface and an entirety of said second well region to a second inner edge of said isolation region.

3. The method of claim 1, wherein forming said drain region comprises forming a drain extension portion that extends laterally below a portion of said gate structure.

4. The method of claim 1, wherein said drain region is formed so as to have a maximum lateral width that is greater than a maximum lateral width of said second well region.

5. The method of claim 1, wherein said first well region is formed so as to have a maximum lateral width that is greater than a maximum combined lateral width of said source region and said gate structure.

6. The method of claim 1, wherein said first type of dopant material is an N-type dopant and said second type of dopant material is a P-type dopant.

7. The method of claim 1, wherein said first type of dopant material is a P-type dopant and said second type of dopant material is an N-type dopant.

8. The method of claim 1, wherein said gate structure is a first gate structure, said well region interface is a first well region interface, said source region is a first source region, and said drain region is a common drain region, the method further comprising:
    forming a third well region doped with said first type of dopant material in said device region laterally adjacent to said first well region and opposite of said second well region;
    forming a second gate structure above said device region, wherein said third well region extends below an entirety of said second gate structure such that a second well region interface formed between said first and third well regions is laterally offset from a drain-side edge of said second gate structure; and
    forming a second source region doped with said second type of dopant material in said device region, wherein said second source region extends laterally from a source-side edge of said second gate structure and across a first portion of said third well region to a second inner edge of said isolation region.

9. The method of claim 8, wherein said common drain region is formed so as to laterally extend from said drain-side edge of said first gate structure to a drain-side edge of said second gate structure across said second portion of said first well region, across said first well region interface, across an entirety of said second well region, across said second well region interface, and across a second portion of said third well region.

10. A method, comprising:
    forming an isolation region in a semiconductor substrate so as to laterally define and electrically isolate a device region;
    forming a first well region doped with a first type of dopant material in said device region;
    forming a second well region doped with a second type of dopant material in said device region laterally adjacent to said first well region, wherein said second type of dopant material has an opposite conductivity type from said first type of dopant material;
    forming a gate structure above said device region, wherein said first well region extends below an entirety of said gate structure such that a well region interface formed between said first and second well regions is laterally offset from a drain-side edge of said gate structure; and
    after forming said gate structure, performing a first ion implantation process to implant said second type of dopant material into said device region so as to form a source extension implant region that extends laterally from a source-side edge of said gate structure across a source-side portion of said first well region and to form a drain extension implant region that extends laterally from a drain-side edge of said gate structure across a drain-side portion of said first well region, across said well region interface, and across at least a portion of said second well region.

11. The method of claim 10, wherein said source extension implant region is formed so as to have a maximum lateral width that is less than a maximum lateral width of said first well region and said drain extension implant region is formed so as to have a maximum lateral width that is greater than a maximum lateral width of said second well region.

12. The method of claim 10, further comprising:
    after forming said source and drain extension implant regions, performing a second ion implantation process to implant said second type of dopant material into said device region so as to form a deep source implant region in said first well region and to form a deep drain implant region in said second well region, wherein an implantation depth of said deep source implant region is greater than an implantation depth of said source extension implant region and an implantation depth of said deep drain implant region is greater than an implantation depth of said drain extension implant region; and
    performing a heating process to activate said second type of dopant materials implanted during said first and second ion implantation processes so as to form a source region in said first well region on a source side of said gate structure and to form a drain region in said first and second well regions on a drain side of said gate structure, said source region comprising a source extension portion that extends under a source-side portion of said gate structure and said drain region comprising a drain extension portion that extends under a drain-side portion of said gate structure.

13. The method of claim 12, wherein at least one of said source extension implant region and said deep source implant region is formed so as to laterally extend across said source-side portion of said first well region to a first inner edge of said isolation region.

14. The method of claim 12, wherein said source region is formed so as to laterally extend from said source-side edge of said gate structure to a first inner edge of said isolation region across a portion of said first well region.

15. The method of claim 12, wherein said drain region is formed so as to laterally extend from said drain-side edge of said gate structure to a second inner edge of said isolation region across a portion of said first well region and across an entirety of said second well region.

16. A method, comprising:
    forming an isolation region in a semiconductor substrate so as to laterally define and electrically isolate a device region;
    forming a first well region doped with a first type of dopant material in said device region;
    forming a second well region doped with a second type of dopant material in said device region laterally adjacent to said first well region, wherein said second type of dopant material has an opposite conductivity type from said first type of dopant material;
    forming a gate structure above said device region, wherein said first well region extends below an entirety of said gate structure such that a well region interface formed between said first and second well regions is laterally offset from a drain-side edge of said gate structure;
    forming a source region doped with said second type of dopant material in a first portion of said first well region, said source region comprising a source extension portion extending laterally below a source-side edge of said gate structure; and
    forming a drain region doped with said second type of dopant material in said second well region and in a second portion of said first well region, said drain region comprising a drain extension portion extending laterally below said drain-side edge of said gate structure, wherein a maximum lateral width of said drain region is greater than a maximum lateral width of said second well region.

17. The method of claim 16, wherein said source region is formed so as to laterally extend across said first portion of said first well region to a first inner edge of said isolation region.

18. The method of claim 16, wherein said drain region is formed so as to laterally extend across said second well region to a second inner edge of said isolation region.

19. The method of claim 16, wherein said first type of dopant material is an N-type dopant and said second type of dopant material is a P-type dopant.

20. The method of claim 16, wherein said first type of dopant material is a P-type dopant and said second type of dopant material is an N-type dopant.

* * * * *